(12) United States Patent
Hailey

(10) Patent No.: US 6,349,038 B1
(45) Date of Patent: *Feb. 19, 2002

(54) EMC CHARACTERISTICS OF A PRINTED CIRCUIT BOARD

(75) Inventor: Jeffery C. Hailey, Austin, TX (US)

(73) Assignee: Dell USA, L.P., Round Rock, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/400,025

(22) Filed: Sep. 21, 1999

(51) Int. Cl.[7] ................................................. H05K 1/11
(52) U.S. Cl. ..................... 361/794; 361/748; 361/760; 361/761; 361/778; 361/800; 361/816; 361/818; 174/35 R; 174/261
(58) Field of Search ................................. 361/794, 780, 361/748, 749, 750, 751, 761, 760, 800, 816, 818, 778, 736; 323/282; 438/619; 257/343; 174/35 R, 261

(56) References Cited

U.S. PATENT DOCUMENTS

| | | | |
|---|---|---|---|
| 5,637,991 A | | 6/1997 | Brown et al. ................ 323/282 |
| 5,767,546 A | * | 6/1998 | Williams et al. ............ 257/343 |
| 5,912,809 A | | 6/1999 | Steigerwald et al. ........ 361/780 |
| 6,219,255 B1 | * | 4/2001 | Teshome ..................... 361/794 |

* cited by examiner

*Primary Examiner*—Jeffrey Gaffin
*Assistant Examiner*—Thanh Y. Tran
(74) *Attorney, Agent, or Firm*—Skjerven Morrill MacPherson, LLP; Stephen A. Terrile (57) ABSTRACT

An apparatus for use with data processing systems. The apparatus provides a split metallic conducting plane having a split formed by a substantially-dielectric-filled moat spanning a width of a side of a first metallic conducting part running substantially parallel to a side of a second metallic conducting part, with the moat structured such that the side of the first metallic part has at least two indentations and such that the side of the second metallic part has at least two indentations, and where a metallic trace is located proximate to the split metallic conducting plane.

23 Claims, 7 Drawing Sheets

EMC CHARACTERISTICS OF A PRINTED CIRCUIT BOARD

BACKGROUND OF THE INVENTION

1. Field of the Invention

The present invention relates, in general, to printed circuit boards.

2. Description of the Related Art

A printed circuit board is a board made of non-conducting material, such as plastic, glass, ceramic, or some other dielectric on which chips and other electronics are mounted. A multilayer printed circuit board is a printed circuit board consisting of two or more layers of board material. Each separate layer has its own metallic tracings to provide electrical connections between various electronic components and to provide connections to other layers. The layers are laminated together to produce a single circuit board to which the components, such as integrated circuits, resistors, and capacitors are attached.

One common multilayer printed circuit board scenario is to have alternating layers, where a first layer is composed in all or part of conducting materials, a second layer is composed mostly of insulating material, and a third layer is composed in all or part of conducting materials, with portions of the conducting materials in the first and third layer connected by conducting materials interposed within channels within the second insulating layer. Such first, second, and third layers typically form part or all of an electric circuit. Many such alternating layers are often used to construct a final circuit.

Figure 1:
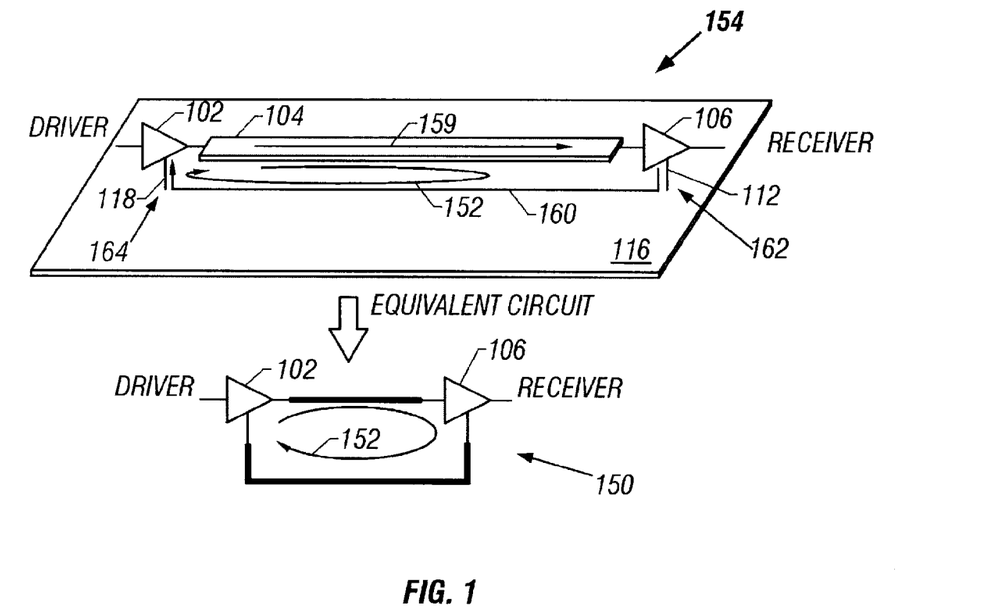
FIG. 1 shows a perspective view of a grossly simplified example of alternating layers within an multilayer printed circuit which forms equivalent electric circuit 150.

With reference now to FIG. 1, shown is a perspective view of a grossly simplified example of alternating layers within an multilayer printed circuit board which form equivalent electric circuit 150. Depicted is that equivalent electric circuit 150 has a current loop 152 from driver 102 to receiver 106. Current loop 152 travels an electrically conductive path provided by multilayer printed circuit board structure 154. Multilayer printed circuit board structure 154 depicts a first layer (not shown) having driver 102, metallic trace 104, and receiver 106 which are contained within a first layer (not shown) of printed circuit board structure 154. Driver 102 is illustrated as electrically connected to metallic trace 104 (e.g., a copper trace). Metallic trace 104 is shown electrically connected to receiver 106. Receiver 106 is depicted as electrically connected to metallic wire 112. Metallic wire 112 is depicted as electrically connected at point 162 with conducting plane 116. Conducting plane 116 is illustrated as electrically connected at point 164 to metallic wire 118. Metallic wire 112 and metallic wire 118 are depicted as contained within a cylindrical channel hollowed out from a second insulating layer (not shown) of printed circuit board structure 154. For sake of illustration and coordination with equivalent electrical circuit 150, electrical current loop 152 is shown flowing from driver 102 to receiver 106 through metallic trace 104. Thereafter, electrical current loop 152 is shown flowing through metallic wire 112, metallic conducting plane 116, and metallic wire 118 back to driver 102.

Figure 2A:
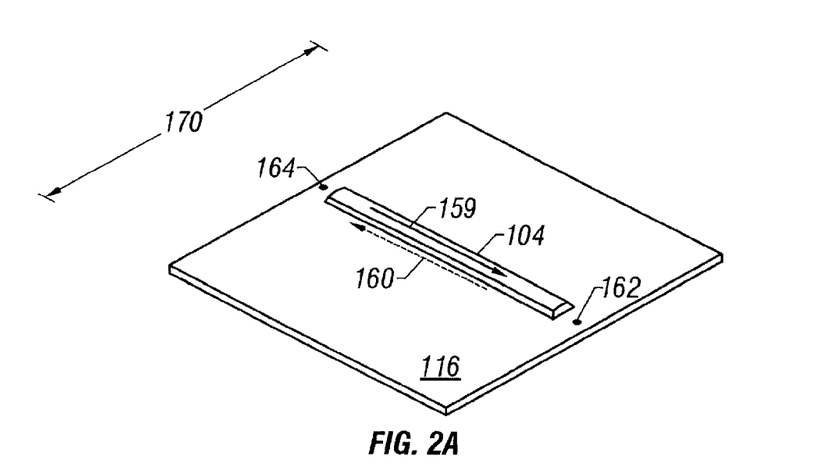
FIG. 2A depicts an isolated perspective view of metallic conducting plane 116 and metallic trace 104.

Referring now to FIG. 2A, depicted is an isolated perspective view of metallic conducting plane 116 and metallic trace 104 of FIG. 1. As has been described, metallic wires 112, 118 (of FIG. 1A) respectively electrically connect with conducting plane 116 at points 162, 164 on conducting plane 116 which are shown relatively "in line" with metallic trace 104. Viewed from the perspective of conducting plane 116, when relatively high frequency alternating current (e.g., current with frequencies substantially in excess of 10 kHz) is flowing in current loop 152 (of FIG. 1), metallic wires 112, 118 (of FIG. 1A) are respectively sourcing and sinking current into points 162, 164 on conducting plane 116. Insofar as conducting plane 116 typically has relatively uniform characteristics, return current 160, flowing between point 162 to point 164, will tend to follow a path substantially underneath metallic trace 104, since for relatively high frequency alternating current the path underneath metallic trace 104 is the path of least impedance for reasons well-known to those in the art. The magnitude of return current 160 will be substantially the same as that of source current 159, since together source current 159 and return current 160 make up loop current 152. However, since conducting plane 116 is of greater width physical width than metallic trace 104, although the majority of return current 160 will attempt to flow under metallic trace 104, in actuality it will be distributed across width 170 of conducting plane 116 in a fashion illustrated by FIG. 2B.

Figure 2B:
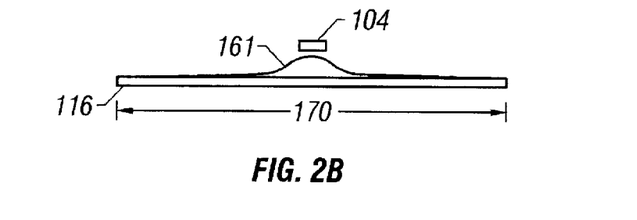
FIG. 2B illustrates an example of distribution 161 of return current 160 on conducting plane 116.

With reference now to FIG. 2B, illustrated is an example of distribution 161 of return current 160 (of FIGS. 1 and 2A) on conducting plane 116. Shown is that the majority of return current 160 (of FIGS. 1 and 2A) is distributed, or flowing, through the portion of conducting plane 116 which lies substantially directly below metallic trace 104.

Referring again to FIG. 1, those skilled in the art will recognize that it is not necessary for metallic wires 112, 118 to be present in order for a return current to be present on conducting plane 116. That is, the mere presence of an alternating current in metallic trace 104 proximate to conducting plane 116 is sufficient to induce a return current such as return current 160 (although metallic trace 104 is shown in a plane above conducting layer 116, metallic trace 104 could be coplanar with conducting plane 116, as will be demonstrated in the detailed description). See e.g., M. Zahn, *Electromagnetic Field Theory: A Problem Solving Approach* 361–363 (1979). Furthermore, in point of fact, in an actual implementation it is likely that both current resulting from metallic wires 112, 118 and from magnetic induction will be present on conducting plane 116. However, for ease of description the discussion herein focuses on the current resulting from the presence of metallic wires 112, 118, although it is to be understood that in addition to or in the alternative to such current resulting from the presence of metallic wires connecting at points 162, 164, a return current can be present arising solely from the presence of alternating current within metallic trace 104, when metallic trace 104 is located proximate to conducting plane 116. This fact is to be borne in mind whenever discussion is made of any return current described in the present application.

Unfortunately, as printed circuit board densities have increased, the structure illustrated in FIGS. 1, 2A, and 2B is becoming less and less practicable. Instead, it is becoming common within the art for conducting plane 116 to be split into two pieces, for a variety of reasons. Splitting conducting plane 116 gives rise to a number of practical problems, a few of which will now be described.

Figure 3:
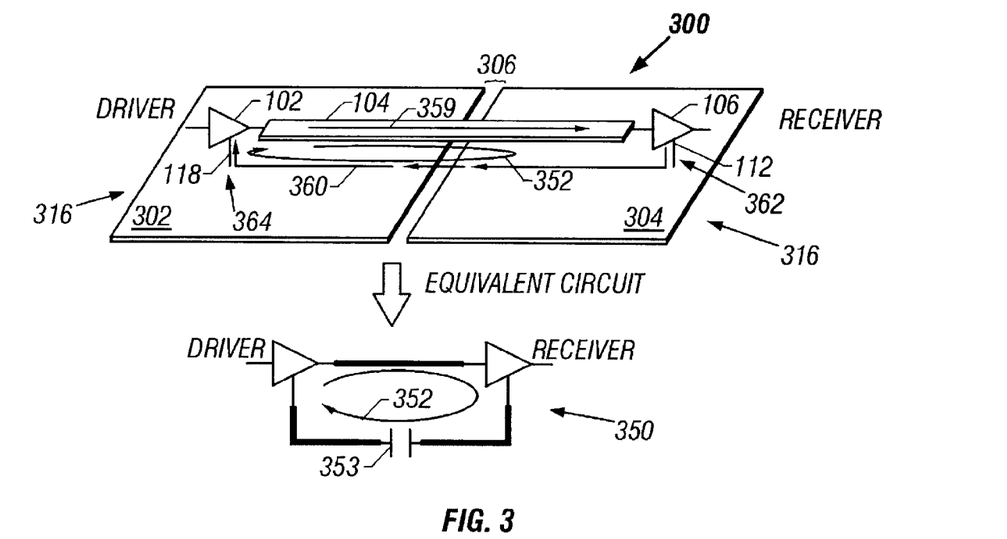
FIG. 3 shows a modified version of multilayer printed circuit board structure 154, referred to as multilayer printed circuit board structure 300, wherein conducting plane 116 is shown broken into first metallic conducting part 302 and second metallic conducting part 304, thereby forming split conducting plane 316.

Referring now to FIG. 3, shown is a modified version of multilayer printed circuit board structure 154, referred to as multilayer printed circuit board structure 300, which is structurally similar to printed circuit board structure 154 except that a conducting plane is shown broken into first metallic conducting part 302 and second metallic conducting part 304, thereby forming split conducting plane 316. Depicted is that first metallic conducting part 302 and second metallic conducting part 304 are separated by dielectric-filled moat 306 which is typically composed of a dielectric material. Shown is that metallic wires 112, 118 respectively connect with split conducting plane 316 at points 362, 364 on split conducting plane 316.

Those skilled in the art will recognize that even though there is no contiguous return path from receiver 106 to driver 102 through split conducting plane 316, driver 102 and receiver 106 will still function because second metallic conducting part 304 and first metallic conducting part 302 function as a sort of "parallel-plate" capacitor. This fact is illustrated by loop current 352 in equivalent electric circuit 350, wherein first metallic conducting part 302 and second metallic conducting part 304 separated by dielectric-filled moat 306 is represented by capacitor 353. Further shown is that loop current 352 can be viewed as composed of a source current 359 and a return current 360, each having substantially equal magnitude (since they make up loop current 352) but different distributions within their respective current flow paths.

Those skilled in the art will recognize that there are government (e.g., the Federal Communications Commission in the United States) and industry electromagnetic compatibility (EMC) standards which set limits on the amount of electromagnetic radiation which may emanate from electrical systems having integrated circuits. As will be described in the detailed description, it has been discovered that split conducting plane 316 composed of first metallic conducting part 302, and dielectric-filled moat 306, and second metallic conducting part 304 of multilayer printed circuit board structure 300 tends to radiate a substantial amount of electromagnetic energy above and beyond that radiated by metallic conducing layer 116 of multilayer printed circuit board structure 300 (which for all practical purposes amounts to almost zero radiated electromagnetic energy compared to that radiated by the foregoing described structure of multilayer printed circuit board structure 300). Insofar as the government and industry standards are aggregative, it is desirable that each printed circuit board component radiate as little electromagnetic energy as possible, because the smallest increase in radiated energy can often make the difference between passing and failing compliance standards.

It is therefore apparent that a need exists to decrease the electromagnetic energy radiated from split metallic conductors carrying electrical energy, such as split conducting plane 316 composed of first metallic conducting part 302, dielectric-filled moat 306, and second metallic conducting part 304 of multilayer printed circuit board structure 300.

SUMMARY OF THE INVENTION

It has been discovered that an apparatus can be produced which will substantially decrease radiated emissions from split metallic conductors carrying electrical energy. The apparatus provides a split metallic conducting plane having a split formed by a dielectric-filled moat spanning a width of a side of a first metallic conducting part running substantially parallel to a side of a second metallic conducting part, with the moat structured such that the side of the first metallic part has at least two indentations and such that the side of the second metallic part has at least two indentations, and where a metallic trace is located proximate to the split metallic conducting plane.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the best contemplated mode for carrying out the independent invention(s) described herein. The description is intended to be illustrative and should not be taken to be limiting.

Figure 4A:
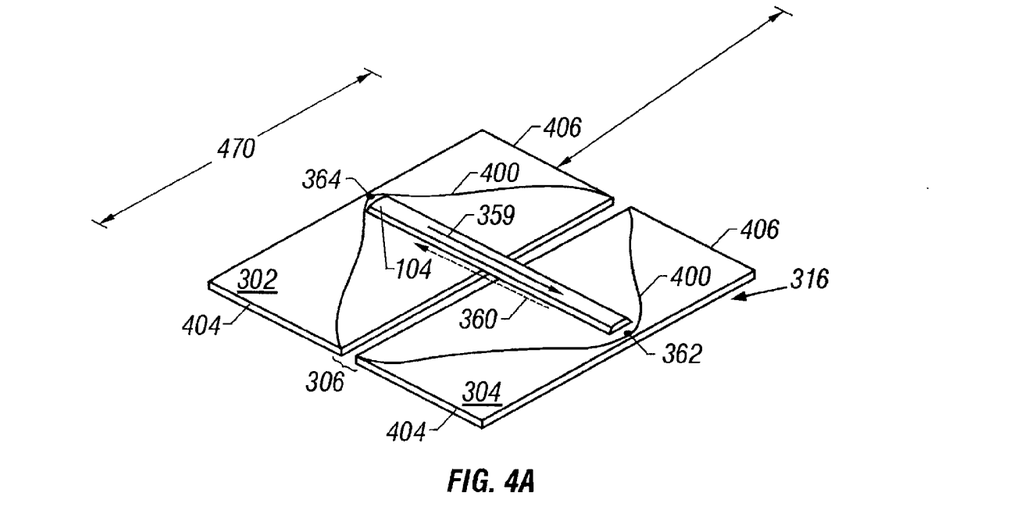
FIG. 4A depicts an isolated perspective view of first metallic conducting part 302 separated from second metallic conducting part 304 by dielectric-filled moat 306.

With reference now to FIG. 4A, depicted is an isolated perspective view of first metallic conducting part 302 separated from second metallic conducting part 304 by dielectric-filled moat 306 of FIG. 3. Because there is no longer a physically contiguous path such as in metallic conducting plane 116 (of FIG. 1), return current 360, seeking the path of least impedance will tend to spread out and follow fan-shaped current flow path 400 (where the flow path has current distribution 401 shown in FIG. 4B, below) from point 162 to point 164. Those skilled in the art will recognize that there are a multitude of ways in which this current behavior can be described, but one grossly-simplified way would be to recognize that for a parallel plate capacitor, the capacitance in farads is roughly given by the equation "C=($\epsilon \times$A)÷d"—where $\epsilon$ is the permittivity in farads/meter of the dielectric separating the conducting plates, A is the area in meters of the plates, and d is the distance in meters separating the plates, and that the impedance Z of a capacitor is roughly given by relation "Z=1/(j$\omega$C)," where $\omega$ is angular frequency in radians/second, and C is capacitance in farads; consequently, the current spreads out across width 470 since this will tend to substantially maximize the capacitance C which will tend to minimize the substantially impedance Z which return current 360 will experience traversing split conducting plane 316.

Even though return current 360 will tend to flow in a fan shaped pattern, the magnitude of return current 360 will tend to be substantially the same as that of source current 359, since together source current 359 and return current 360 make up loop current 352 (of FIG. 3). (In addition, note that return current 360 would also be roughly equal to source current 359 even if return current 360 were magnetically induced by relatively high frequency source current 359.).

Figure 4B:
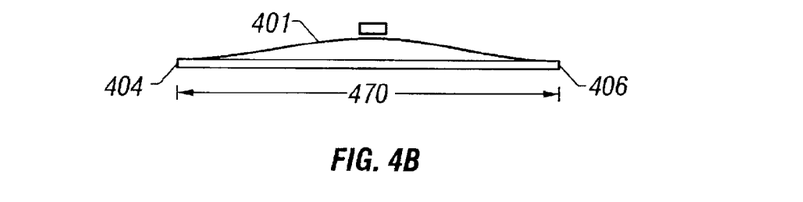
FIG. 4B illustrates an example of distribution 401 of return current 360 on first metallic conducting part 302 and second metallic conducting part 304 at dielectric-filled moat 306.

Referring now to FIG. 4B, illustrated is an example of distribution 401 of return current 360 (of FIGS. 3 and 4A) on first metallic conducting part 302 (of FIGS. 3 and 4A) and second metallic conducting part 304 at dielectric-filled moat 306 (of FIGS. 3 and 4A). Shown is that at dielectric-filled moat 306 return current 360 is distributed widely across width 470 of first metallic conducting part 302 and second metallic conducting part 304 in the manner expected in view of fan-shaped current flow path 400 (of FIG. 4A). Even though it might appear from the illustration that current distribution drops to zero at some point interior to peripheral edge 404 and peripheral edge 406, it is to be understood that such is not the case, and that in fact some current is in fact flowing up to and adjacent with the peripheral edge 404 and peripheral edge 406 as is illustrated by fan-shaped current flow 400 (of FIG. 4A).

Referring again to FIG. 4A, because return current 360 follows fan-shaped current flow path 400, or equivalently has distribution 401, the impedance encountered by return current 360 between points 362 and 364 is substantially greater than the impedance encountered by return current 160 between points 162 and 164 described in relation to FIGS. 1, 2A, and 2B, above. Consequently, return current 360 will give rise to a greater voltage across the impedance existing between points 362 and 364 than that caused by return current 160 across the impedance existing between points 162 and 164 described in relation to FIGS. 1, 2A, and 2B. This greater voltage drop tends to create radiated electromagnetic emissions from split conducting plane 316 greater than those of conducting plane 116 (of FIG. 1).

Those skilled in the art will recognize that EMC standards are usually specified as a function of some distance (illustrated as "test distance d" in FIG. 4A) from an edge of a printed circuit board component. It has been discovered that the strength of radiated emissions detected at a given distance from a split conducting plane will be reduced if the impedance encountered by a return current traversing the split conducting plane is reduced. It has also been discovered that the strength of radiated emissions detected at a given distance from a split conducting plane will be reduced if the voltage generated by a return current traversing the split conducting plane is concentrated away from the periphery of the board. Restated, it has been found advantageous to substantially minimize the impedance encountered by a return current traversing a split conducting plane and to substantially minimize the flow of the return current at or near the peripheries of the split conducting plane which the return current is traversing.

Figure 5A:
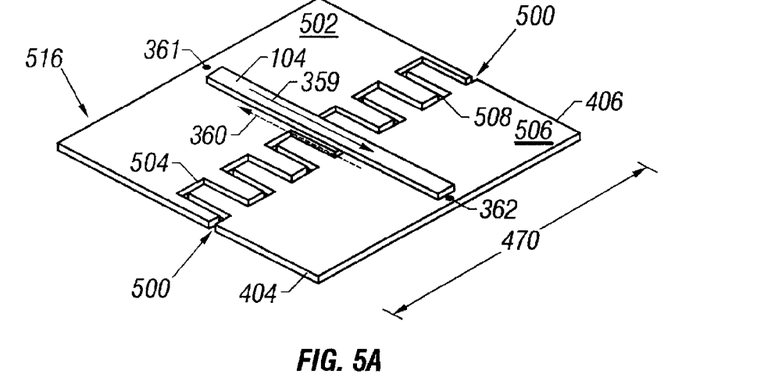
FIG. 5A depicts split conducting plane 516 wherein the split is depicted as repeating rectangular structure dielectric-filled moat 500 which substantially minimizes an impedance encountered by return current 360 and which substantially minimizes the flow of current at or near peripheries 404, 406 of split conducting plane 516 such as multilayer printed circuit board structure 300.
Figure 5B:
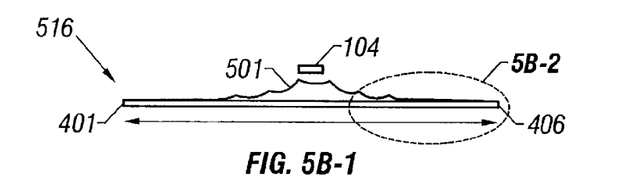
FIG. 5B illustrates an example of distribution 501 of return current 360 on first metallic conducting part 502 having a repeating rectangular structure 504 and a second metallic conducting part 506 having a repeating rectangular structure 508.
FIG. 5C depicts a split conducting plane 516 wherein the split is shown as a "tighter" repeating rectangular structure dielectric-filled moat 500 such that multiple rectangular structures exist under metallic trace 104.
Figure 5B:
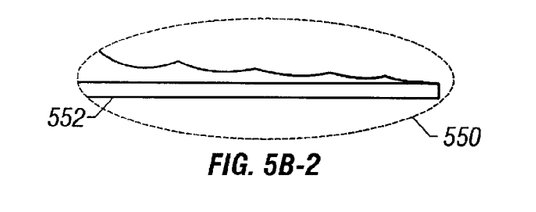

With reference now to FIG. 5A, depicted is split conducting plane 516 which is structurally similar to split conducting plane 316 except that the split is depicted as repeating rectangular structure dielectric-filled moat 500. Replacing split conducting plane 316 in multilayer printed circuit board structure 300 (of FIG. 3) with split conducting plane 516 substantially minimizes an impedance encountered by return current 360 between points 362 and 364 and substantially minimizes the flow of current at or near peripheries 404, 406 of split conducting plane 516. Specifically, depicted is a side having repeating rectangular structure 504 of first metallic conducting part 502 and side having repeating rectangular structure 508 of second metallic conducting part 506. Sides having repeating rectangular structures 504 and 508 are constructed so that they interdigitate as shown. Sides having repeating rectangular structures 504 and 508 are separated by repeating rectangular structure dielectric-filled moat 500. Notice that, the effective length of the faces of a "parallel-plate-like" capacitor formed by side having repeating rectangular structure 504 of first metallic conducting part 502 and side having repeating rectangular structure 508 of second metallic conducting part 506 has been substantially increased by sides having repeating rectangular structures 504 and 508. Consequently, the impedance encountered by return current 360 will be decreased and thus the voltage drop from point 362 to 364 will be decreased, which will decrease radiated emissions. In addition, the decreased impedance will allow more current to flow in the lower resistance path under metallic trace 104, which will correspondingly decrease current flow near the peripheries 404, 406 of split conducting plane 516, which will also decrease radiated emissions.

Referring now to FIG. 5B, illustrated is an example of distribution 501 of return current 360 (of FIG. 5A) on side having repeating rectangular structure 504 (of FIG. 5A) of first metallic conducting part 502 (of FIG. 5A) and side having repeating rectangular structure 508 (of FIG. 5A) of second metallic conducting part 506 (of FIG. 5A). Shown is that at dielectric-filled moat 510 (of FIG. 5A) return current 360 (of FIG. 5A) is distributed across first metallic conducting part 502 (of FIG. 5A) having a repeating rectangular structure 504 (of FIG. 5A) and a second metallic conducting part 506 (of FIG. 5A) having a repeating rectangular structure 508 (of FIG. 5A) in a manner such that the majority of the return current is concentrated near the interior of the board. Further shown in expanded view 550 of periphery region 552 of split conducting plane 516 is that side having repeating rectangular structure 504 (of FIG. 5A) of first metallic conducting part 502 (of FIG. 5A) and side having repeating rectangular structure 508 (of FIG. 5A) of second metallic conducting part 506 (of FIG. 5A) shifts distribution of current away from periphery 406 (of FIG. 5A) of split conducting plane 516, which also reduces measured electromagnetic emissions at some distance d from the board.

Figure 5C:
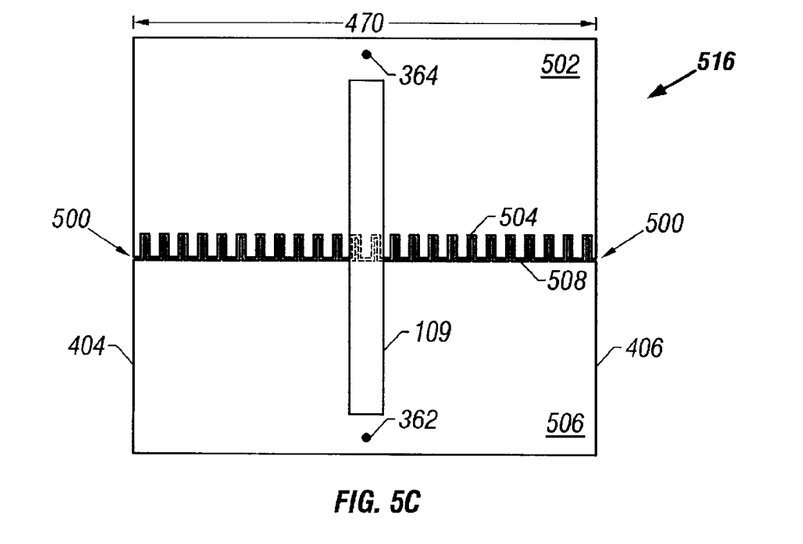

With reference now to FIG. 5C, depicted is a split conducting plane 516 wherein the split is shown as a "tighter" repeating rectangular structure dielectric-filled moat 500 such that multiple rectangular structures exist under metallic trace 104. Since there are even more interdigitated rectangular shapes spanning split conducting plane 516, this allows even greater concentration of the distribution of current on the interior of split conducting plane 516 than that possible with the structure shown in FIG. 5A. Consequently, the structure shown in FIG. 5C will allow an even greater reduction in radiated emissions over that shown in FIG. 5A.

Figure 6:
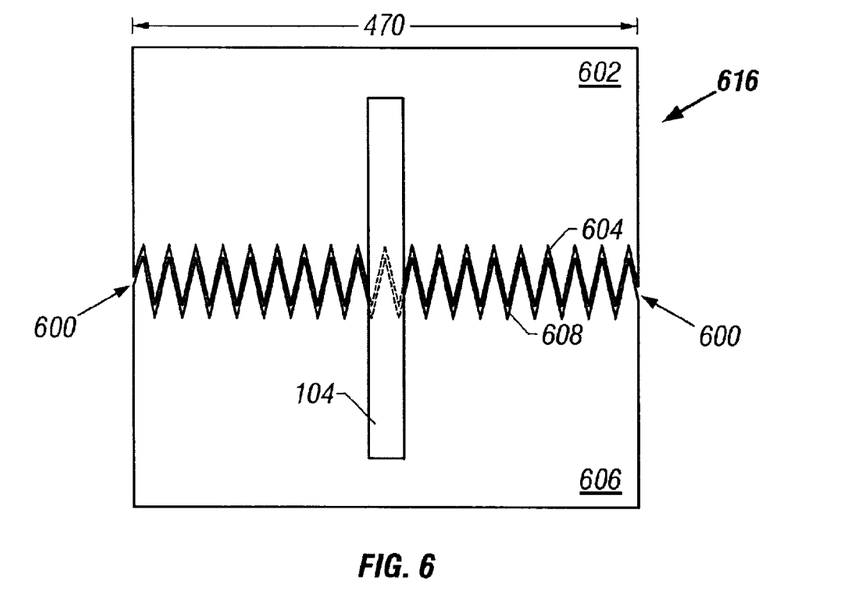
FIG. 6 depicts split conducting plane 616 wherein the split is depicted as repeating triangular structure dielectric-filled moat 600.

Referring now to FIG. 6, depicted is split conducting plane 616 wherein the split is depicted as repeating triangular structure dielectric-filled moat 600. Specifically, depicted is side having a repeating triangular structure 604 of first metallic conducting part 602, and having a repeating triangular structure 608 of second metallic conducting part 606. Sides having repeating triangular structures 604 and 608 are constructed so that they interdigitate as shown. Sides having repeating triangular structures 604 and 608 are separated by dielectric-filled moat 600. Dielectric-filled repeating triangular structure moat 600 reduces radiated emissions in a manner analogous to repeating rectangular structure dielectric-filled moat 500.

Figure 7:
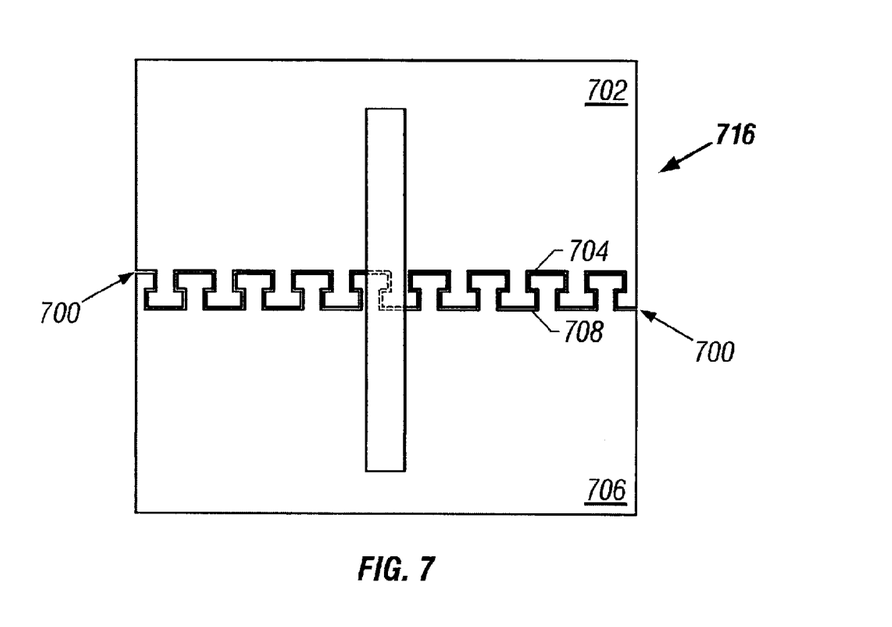
FIG. 7 depicts split conducting plane 716 wherein the split is illustrated as repeating T-shaped structure dielectric-filled moat 700.

With reference now to FIG. 7, depicted is split conducting plane 716 wherein the split is illustrated as repeating T-shaped structure dielectric-filled moat 700. Specifically, depicted is side having repeating T-shaped structure 704 of first metallic conducting part 702 and side having repeating T-shaped structure 708 of second metallic conducting part 706. Sides having repeating T-shaped structures 704 and 708 are constructed so that they interdigitate as shown. Sides having repeating T-shaped structures 704 and 708 are separated by repeating T-shaped structure dielectric-filled moat 700. Dielectric-filled repeating T-shaped structure moat 700 reduces radiated emissions in a manner analogous to repeating rectangular structure dielectric-filled moat 500.

Figure 8:
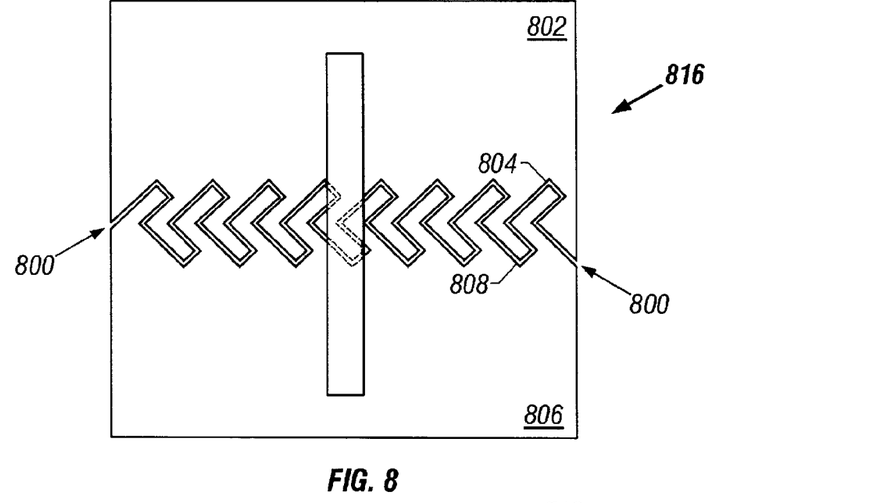
FIG. 8 depicts split conducting plane 816 wherein the split is shown as repeating arrow-shaped structure dielectric-filled moat 800.

Referring now to FIG. 8, depicted is split conducting plane 816 wherein the split is shown as repeating arrow-shaped structure dielectric-filled moat 800. Specifically, depicted is side having repeating arrow-shaped structure 804 of first metallic conducting part 802, and side having a repeating arrow-shaped structure 808 of second metallic conducting part 806. Sides having repeating arrow-shaped structures 804 and 808 are constructed so that they interdigitate as shown. Sides having repeating arrow-shaped structures 804 and 808 are separated by repeating arrow-shaped dielectric-filled moat 800. Repeating arrow-shaped dielectric-filled moat 800 reduces radiated emissions in a manner analogous to repeating rectangular structure dielectric-filled moat 500.

Figure 9A:
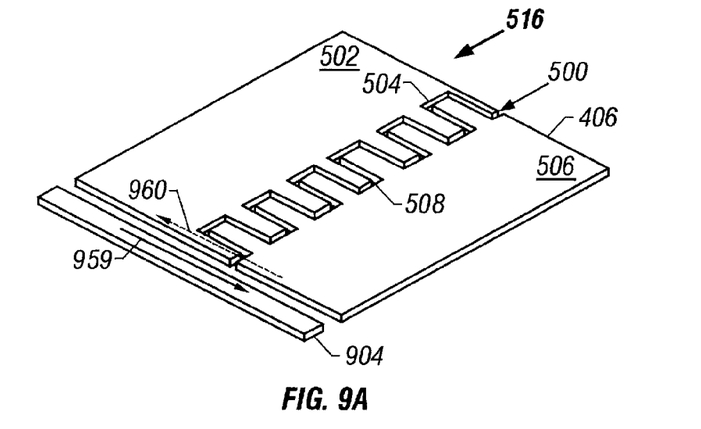
FIG. 9A depicts split conducting plane 516 wherein the split is depicted as repeating rectangular structure dielectric-filled moat 500, and wherein metallic trace 904 is shown alongside, or relatively coplanar with, split conducting plane 516.
Figure 9B:
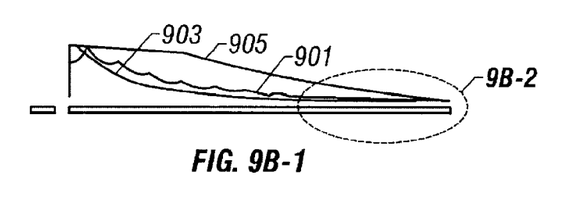
FIG. 9B illustrates an example of distribution 901 of return current 960 on side having repeating rectangular structure 504 of first metallic conducting part 502, and side having repeating rectangular structure 508 of second metallic conducting part 506.
Figure 9B:
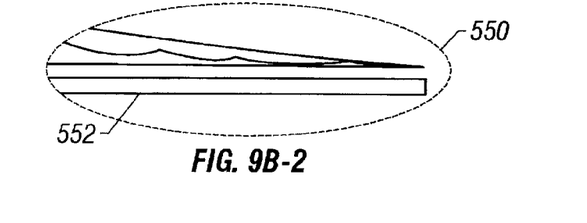

With reference now to FIG. 9A, depicted is split conducting plane 516 wherein the split is depicted as repeating rectangular structure dielectric-filled moat 500, and wherein metallic trace 904 is shown alongside, or relatively coplanar with, split conducting plane 516. Specifically, illustrated is that metallic trace 904 carries source current 959 from a driver (not shown) and that split conducting plane 516 carries return current 960, equal in magnitude to source current, from a receiver (not shown). Depicted is side having repeating rectangular structure 504 of first metallic conducting part 502, and side having repeating rectangular structure 508 of second metallic conducting part 506. Sides having repeating rectangular structures 504 and 508 are constructed so that they interdigitate as shown. Sides having repeating rectangular structures 504 and 508 are separated by repeating rectangular structure dielectric-filled moat 500. Repeating rectangular structure dielectric-filled moat 500 reduces radiated emissions in a manner analogous to that described in relation to FIG. 5A, such that the radiated emissions from periphery 406 of split conducting plane 516 is substantially reduced. The situation shown in FIG. 9A is that where return current 960 is induced magnetically (it is to be assumed that split conducting plane 516 is part of a larger circuit which functions to form a continuous loop). However, it is also to be understood that return current 960 could also be generated by an actual physically connected circuit between metallic trace 904 and split conducting plane 516 analogous to the circuit illustrated in FIG. 3.

Referring now to FIG. 9B, illustrated is an example of distribution 901 of return current 960 on side having repeating rectangular structure 504 (of FIG. 9A) of first metallic conducting part 502 (of FIG. 9A) and side having repeating rectangular structure 508 (of FIG. 9A) of second metallic conducting part 506 (of FIG. 9A). Shown is that return current 960 has distribution 901 across side having repeating rectangular structure 504 (of FIG. 9A) of first metallic conducting part 502 (of FIG. 9A) and side having repeating rectangular structure 508 (of FIG. 9A) of second metallic conducting part 506 (of FIG. 9A) in a manner such that the majority of return current 960 is concentrated near the edge of the board nearest metallic trace 904, which reduces measured electromagnetic emissions at some distance d from opposite board edge. Further shown are current distribution 903 where the metallic conducting plane a continuous plane, and current distribution 905 where the metallic conducting plane is a split plane. It is to be understood that although split conducting plane 516 (of FIG. 9A) was discussed above in relation to FIGS. 9A and 9B, previously discussed conducting planes 616, 716, and 816 could likewise be utilized in the same way that split conducting plane 516 (of FIG. 9A) is utilized in FIGS. 9A and 9B. Further shown in expanded view 950 of periphery region 552 (of FIG. 9A) of split conducting plane 516 (of FIG. 9A) is that side having repeating rectangular structure 504 (of FIG. 9A) of first metallic conducting part 502 (of FIG. 9A) and side having repeating rectangular structure 508 (of FIG. 9A) of second metallic conducting part 506 (of FIG. 9A) shifts distribution of current away from periphery 406 (of FIG. 9A) of split conducting plane 516, which also reduces measured electromagnetic emissions at some distance d from the board.

Figure 10:
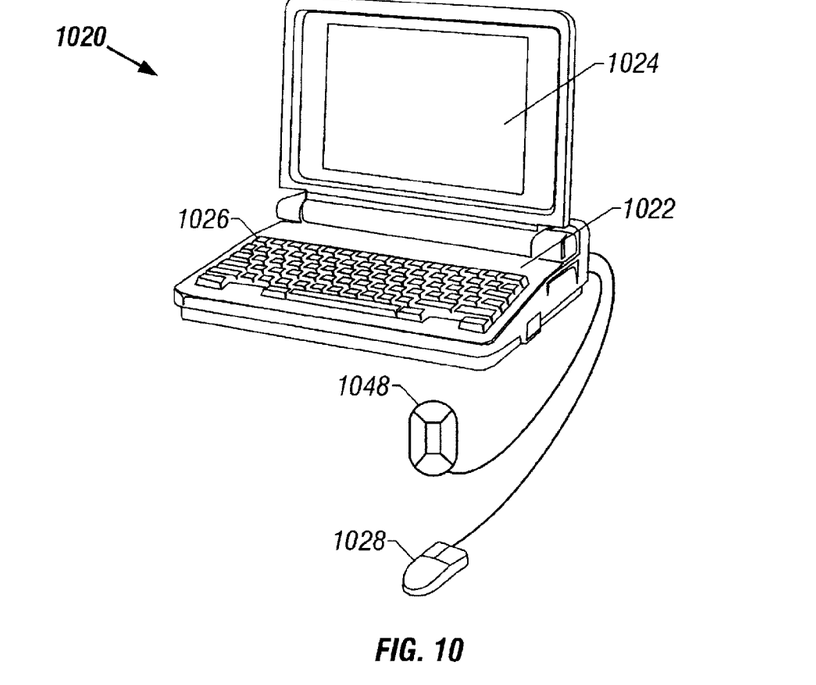
FIG. 10 depicts a pictorial representation of a data-processing system in which printed circuit boards are utilized.

With reference now to FIG. 10, depicted is a pictorial representation of a data-processing system in which printed circuit boards are utilized. A network server computer 1020 is depicted. Shown present and associated with network server computer 1020 are system unit 1022, video display device 1024, keyboard 1026, mouse 1028, and microphone 1048. Network server computer 1020 may be implemented utilizing any suitable network server computer such as the Dell PowerEdge network server computer. ("Dell" and "PowerEdge" are trademarks of Dell Computer Corporation, located in Round Rock, Tex.). Those skilled in the art will recognize that various implementations of network server computer 1020 can have many different components, such as those components illustrated below in FIG. 11 and FIG. 12. It will be understood by those in the arts the majority of components illustrated in FIG. 11 and FIG. 12 will be interconnected via the use of printed circuit boards. Accordingly, the above described structures of FIGS. 5A–9B will be particularly useful with such printed circuit boards when a metallic trace, such as metallic trace 1004, appears proximate to a split metallic conducting plane within the printed circuit board.

Figure 11:
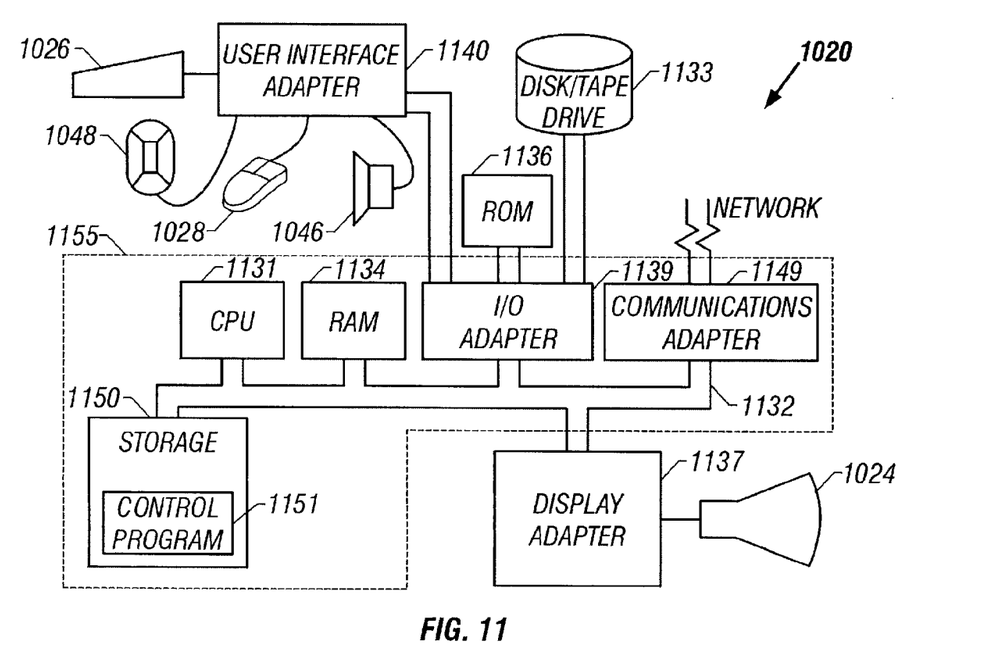
FIG. 11 illustrates selected components which may be present within an implementation of network server computer 1020.

Referring now to FIG. 11, illustrated is selected components which may be present within an implementation of network server computer 1020. Network server computer 1020 includes a Central Processing Unit ("CPU") 1131, which is intended to be representative of either a conventional microprocessor, or more modern multiprocessors, and a number of other units interconnected via system bus 1132. Network server computer 1020 includes random-access memory ("RAM") 1134, read-only memory ("ROM") 1136, display adapter 1137 for connecting system bus 1132 to video display device 1024, and I/O adapter 1139 for connecting peripheral devices (e.g., disk and tape drives 1133) to system bus 1132. Video display device 1024 is the visual output of computer 1020, which can be a CRT-based video display well-known in the art of computer hardware. However, video display device 1024 can also be an LCD-based or a gas plasma-based flat-panel display. Network server computer 1020 further includes user interface adapter 1140 for connecting keyboard 1026, mouse 1028, speaker 1046, microphone 1048, digital camera and/or other user interface devices (not shown), such as a touch screen device (not shown), to system bus 1132 through I/O adapter 1139. Communications adapter 1149 connects network server computer 1020 to a data-processing network. Shown for sake of illustration is that printed circuit board 1155 interconnects a number of the foregoing described components.

Any suitable machine-readable media may retain the graphical user interface, such as RAM 1134, ROM 1136, a magnetic diskette, magnetic tape, or optical disk (the last three being located in disk and tape drives 1133). Any suitable operating system and/or associated graphical user interface (e.g., Microsoft Windows) may direct CPU 1131. Other technologies can also be utilized in conjunction with CPU 1131, such as touch-screen technology or human voice control. In addition, network server computer 1020 includes a control program 1151 which resides within computer storage 1150.

Those skilled in the art will appreciate that the hardware depicted in FIG. 11 may vary for specific applications. For example, other peripheral devices such as optical disk media, audio adapters, or programmable devices, such as PAL or EPROM programming devices well-known in the art of computer hardware, and the like may be utilized in addition to or in place of the hardware already depicted.

Those skilled in the art will recognize that network server computer 1020 can be described in relation to other network server computers which perform essentially the same functionalities, irrespective of architectures.

Figure 12:
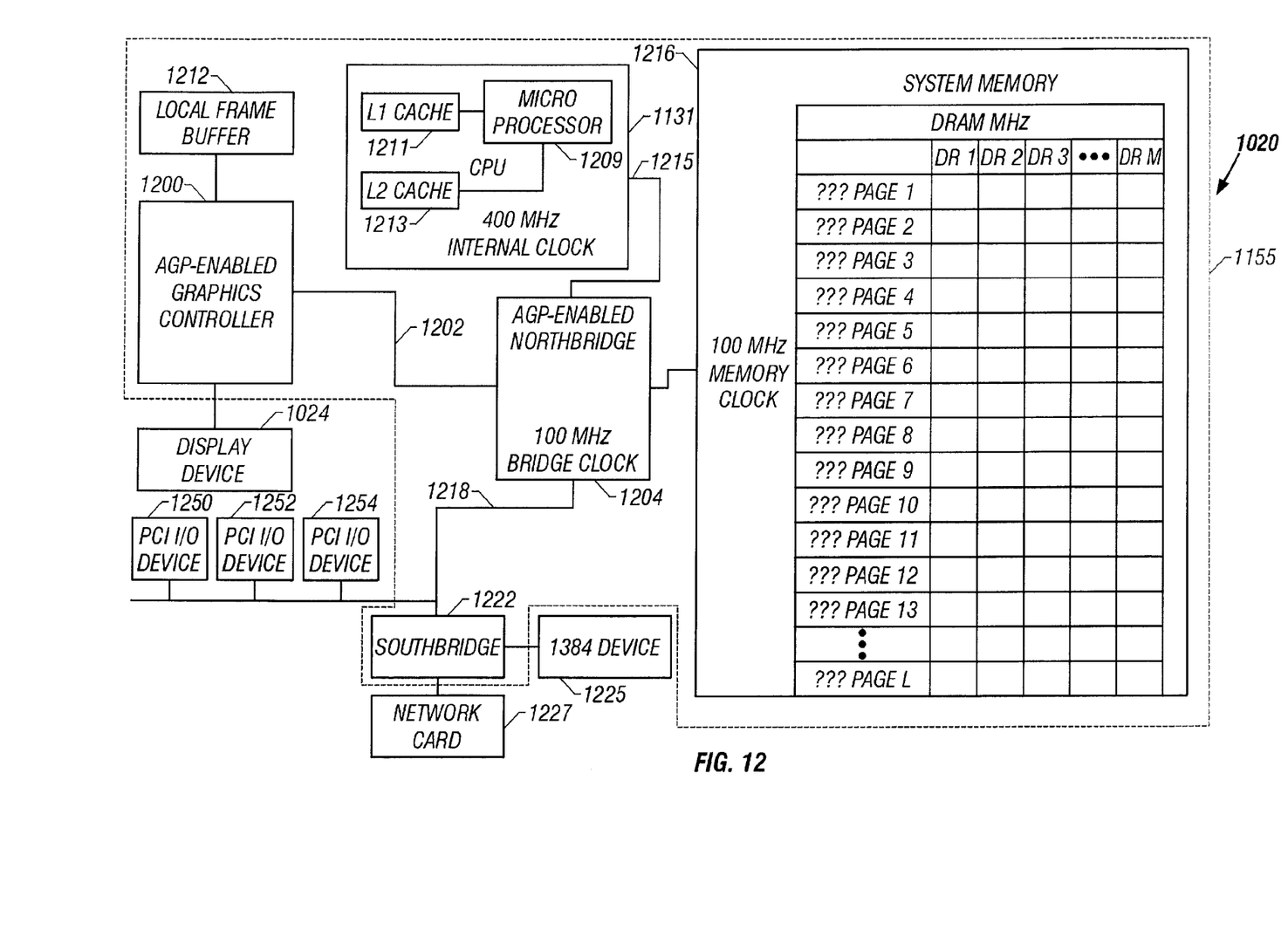
FIG. 12 illustrates are selected components which may be present within an implementation of network server computer 1020.

With reference now to FIG. 12, illustrated is are selected components which may be present within an implementation of network server computer 1020. Shown are AGP-enabled graphics controller 1200, AGP interconnect 1202 (a data bus), and AGP-enabled Northbridge 1204. Not shown, but deemed present is an AGP-enabled operating system. The term AGP-enabled is intended to mean that the so-referenced components are engineered such that they interface and function under the standards defined within the AGP interface specification (Intel Corporation, *Accelerated Graphics Port Interface Specification*, Revision 1.0 (Jul., 31, 1996)). Further depicted are video display device 1024, local frame buffer 1212, Central Processing Unit (CPU) 1131 (wherein are depicted microprocessor 1209, L1 Cache 1211, and L2 Cache 1213), CPU bus 1215, system memory 1216, Peripheral Component Interconnect (PCI) bus 1218, various PCI Input-Output (I/O) devices 1250, 1252, and 1254, Southbridge 1222, 1394 Device 1225, and network card 1227. Shown for sake of illustration is that printed circuit board 1155 interconnects a number of the foregoing described components.

The foregoing components and devices are used herein as examples for sake of conceptual clarity. As for (non-exclusive) example, CPU 1131 is utilized as an exemplar of any general processing unit, including but not limited to multiprocessor units; CPU bus 1215 is utilized as an exemplar of any processing bus, including but not limited to multiprocessor buses; PCI devices 1250-1254 attached to PCI bus 1218 are utilized as an exemplar of any input-output devices attached to any I/O bus; AGP Interconnect 1202 is utilized as an exemplar of any graphics bus; AGP-enabled graphics controller 1200 is utilized as an exemplar of any graphics controller; Northbridge 1204 and Southbridge 1222 are utilized as exemplars of any type of bridge; 1394 device 1225 is utilized as an exemplar of any type of isochronous source; and network card 1227, even though the term "network" is used, is intended to serve as an exemplar of any type of synchronous or asynchronous input-output cards. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Generally, each bus utilizes an independent set of protocols (or rules) to conduct data (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 1204, Southbridge 1222, and other bridges shown in that it is to be understood that such can translate and coordinate between various data buses and/or devices which communicate through the bridges.

Other Embodiments

Several various embodiments have been described above, and it will be obvious to those skilled in the art that, based upon the teachings herein, changes and modifications may be made without departing from this invention and its broader aspects. That is, all examples set forth herein are intended to be exemplary and non-limiting.

As an example of the forgoing-referenced changes and modifications, each straight-line segment in a structure, such as the repeating rectangular structures discussed above, could itself be replaced by a structure which increases effective length (e.g., a specific side of the rectangular structure could itself be replaced by a repeating triangular structure across that specific side). As another example of the foregoing-referenced changes and modifications, a non-repetitive pattern could be utilized to span the width of a split conducting plane rather than a repeating structure (e.g., a rectangular structure, followed by a circular structure, followed by a triangular structure, followed by a star-shaped structure, etc.). Accordingly, the above-described architectures are not intended to be limiting.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For example, as an aid to understanding, the following appended claims may contain usage of the phrases "at least one" or "one or more," or the indefinite articles "a" or "an," to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements.

What is claimed is:

1. A printed circuit board comprising:
   a split conducting plane having:
      (i) a first conducting part and a second conducting part;
      (ii) interdigitated first and second sides, respectively associated with the first conducting part and the second conducting part; and
      (iii) a dielectric moat intervening the first and second sides; and
   a metallic trace proximate to the split conducting plane for coupling a driver device that is connected to the first conducting part to a receiver device that is connected to the second conducting part.

2. A printed circuit board as defined in claim 1, further comprising a first conductor for connecting the driver device to the first conducting part and a second conductor for connecting the receiver device to the second conducting part.

3. A printed circuit board as defined in claim 2, wherein the metallic trace traverses the dielectric moat.

4. A printed circuit board as defined in claim 1, wherein the moat is formed as a repeating rectangular structure.

5. A printed circuit board as defined in claim 1, wherein the moat is formed as a repeating triangular structure.

6. A printed circuit board as defined in claim 1, wherein the moat is formed as a repeating T-shaped structure.

7. A printed circuit board as defined in claim 1, wherein the moat is formed as a repeating arrow structure.

8. A printed circuit board comprising:
   a first conducting part;
   a second conducting part;
   a metallic trace proximate to the first conducting part and to the second conducting part for coupling a driver device that is connected to the first conducting part to a receiver device that is connected to the second conducting part; and
   interdigitated means for reducing electromagnetic interference that emanates from the printed circuit board.

9. A printed circuit board as defined in claim 8, wherein the interdigitated means comprises:
   a first side associated with the first conductor part;
   a second side associated with the second conductive part; and
   an interdigitated dielectric moat intervening the first side and the second side.

10. A printed circuit board as defined in claim 9, further comprising a first conductor for connecting the driver device to the first conducting part and a second conductor for connecting the receiver device to the second conducting part.

11. A printed circuit board as defined in claim 10, wherein the metallic trace traverses the dielectric moat.

12. A printed circuit board as defined in claim 9, wherein the moat is formed as a repeating rectangular structure.

13. A printed circuit board as defined in claim 9, wherein the moat is formed as a repeating triangular structure.

14. A printed circuit board as defined in claim 9, wherein the moat is formed as a repeating T-shaped structure.

15. A printed circuit board as defined in claim 9, wherein the moat is formed as a repeating arrow structure.

16. A printed circuit board as defined in claim 9, wherein the first conducting part and the second conducting part are mutually coplanar.

17. A printed circuit board as defined in claim 16, further comprising a first conductor for connecting the driver device to the first conducting part and a second conductor for connecting the receiver device to the second conducting part.

18. A computer system comprising:
   a printed circuit board comprising:
      (i) a first and a second conducting parts;
      (ii) interdigitated first and second sides, respectively associated with the first conducting part and the second conducting part; and
      (iii) a dielectric moat intervening the first and second sides; and
   a metallic trace proximate to the first and to the second conducting parts for connecting a driver device to a receiver device.

19. A printed circuit board as defined in claim 18, wherein the driver device is connected to a first point on the first conducting part and the receiver device is connected to a second point on the second conducting part.

20. A printed circuit board as defined in claim 19, wherein the metallic trace traverses the dielectric moat.

21. A multilayer printed circuit board comprising:
a first layer comprising a metallic trace;
a second layer comprising:
 (i) a first conducting part;
 (ii) a second conducting part; and
 (iii) an interdigitated dielectric moat intervening the first conducting part and the second conducting part;
a first conductor connecting the first layer to the first conducting part; and
a second conductor connecting the first layer to the second conducting part.

22. A multilayer printed circuit board as defined in claim 21, wherein the metallic trace is disposed proximate to the first conducting part and to the second conducting part.

23. A multilayer printed circuit board as defined in claim 22, wherein the metallic conductor traverses the interdigitated dielectric moat.

* * * * *